US008216361B2

(12) United States Patent
Knerer et al.

(10) Patent No.: US 8,216,361 B2
(45) Date of Patent: Jul. 10, 2012

(54) MONOCRYSTALLINE SEMICONDUCTOR WAFER COMPRISING DEFECT-REDUCED REGIONS AND METHOD FOR PRODUCING IT

(75) Inventors: Dieter Knerer, Burghausen (DE); Andreas Huber, Garching (DE); Ulrich Lambert, Emmerting (DE); Friedrich Passek, Adlkofen (DE)

(73) Assignee: Siltronic AG, Munich (DE)

( * ) Notice: Subject to any disclaimer, the term of this patent is extended or adjusted under 35 U.S.C. 154(b) by 0 days.

(21) Appl. No.: 13/226,772

(22) Filed: Sep. 7, 2011

(65) Prior Publication Data

US 2011/0318546 A1    Dec. 29, 2011

Related U.S. Application Data

(63) Continuation of application No. 11/828,392, filed on Jul. 26, 2007, now Pat. No. 8,088,219.

(30) Foreign Application Priority Data

Jul. 27, 2006 (DE) .......................... 10 2006 034 786

(51) Int. Cl.
    *C30B 29/04* (2006.01)
(52) U.S. Cl. ...................... 117/8; 117/9; 117/13; 117/20
(58) Field of Classification Search .................. 117/8, 9, 117/13, 20
    See application file for complete search history.

(56) References Cited

U.S. PATENT DOCUMENTS

| 5,935,320 | A | 8/1999 | Graef et al. |
| 5,939,770 | A | 8/1999 | Kageyama |
| 6,120,749 | A | 9/2000 | Takano et al. |
| 6,228,164 | B1 | 5/2001 | Ammon et al. |
| 6,743,689 | B1 | 6/2004 | Paton et al. |
| 2006/0027159 | A1 | 2/2006 | Shibayama et al. |
| 2007/0059904 | A1 | 3/2007 | Izumome |
| 2009/0242843 | A1 | 10/2009 | Ebara |

FOREIGN PATENT DOCUMENTS

| DE | 249 998 A1 | 9/1987 |
| DE | 198 35 616 A1 | 2/2000 |
| EP | 0068094 A2 | 1/1983 |
| EP | 0829559 B2 | 12/1999 |
| EP | 0972094 B1 | 10/2001 |

(Continued)

OTHER PUBLICATIONS

K. Yamabe et al., Proc. Int. Reliability Phys. Symp., IEEE, New York, pp. 184-190, 1983.

(Continued)

*Primary Examiner* — Bob M Kunemund
(74) *Attorney, Agent, or Firm* — Brooks Kushman P.C.

(57) ABSTRACT

Monocrystalline semiconductor wafers have defect-reduced regions, the defect-reduced regions having a density of GOI-relevant defects within the range of $0/cm^2$ to $0.1/cm^2$ and occupy overall an areal proportion of 10% to 100% of the planar area of the semiconductor wafer, wherein the remaining regions of the semiconductor wafer have a significantly higher defect density than the defect-reduced regions. The wafers may be produced by a method for annealing GOI relevant defects in the wafer, by irradiating defined regions of a side of the semiconductor wafer by laser wherein each location is irradiated with a power density of 1 $GW/m^2$ to 10 $GW/m^2$ for at least 25 ms, wherein the laser emits radiation of a wavelength above the absorption edge of the wafer semiconductor material and wherein the temperature of the wafer rises by less than 20 K as a result of irradiation.

13 Claims, 2 Drawing Sheets

FOREIGN PATENT DOCUMENTS

| | | |
|---|---|---|
| JP | 57136334 A | 8/1982 |
| JP | 02066946 A | 3/1990 |
| JP | 09-202690 A | 8/1997 |
| JP | 2001-181090 A | 7/2001 |
| JP | 2003173984 A | 6/2003 |
| JP | 200780914 A | 3/2007 |
| JP | 200828355 A1 | 2/2008 |

OTHER PUBLICATIONS

M. Muranaka et al., Jpn. J. appl. Phys. vol. 37, pp. 1240-1243, 1998.

E. Dornberger et al., Journal of the Electrochemical Society 149 (4), G226-G231, 2002.

G.K. Celler et al., Journal of Applied Physics, vol. 93, No. 9, pp. 4955-4978, 2003.

MONOCRYSTALLINE SEMICONDUCTOR WAFER COMPRISING DEFECT-REDUCED REGIONS AND METHOD FOR PRODUCING IT

CROSS-REFERENCE TO RELATED APPLICATION

This application is a continuation of and claims priority to U.S. application Ser. No. 11/828,392 filed Jul. 26, 2007, which claims priority to German Application No. DE 10 2006 034 786.2, filed Jul. 27, 2006, all of which are incorporated herein by reference.

BACKGROUND OF THE INVENTION

1. Field of the Invention

The invention relates to a monocrystalline semiconductor wafer having regions with a very low and homogeneous density of GOI-relevant defects. The invention also relates to a method for annealing GOI-relevant defects in a monocrystalline semiconductor wafer, wherein at least one side of the semiconductor wafer is irradiated by means of a laser.

2. Background Art

Semiconductor wafers, in particular silicon wafers, are generally used for producing microelectronic components. In the semiconductor industry, and in particular in silicon technology, which has advanced very far scientifically and also technologically, the quality requirements of the semiconductor wafers increase further and further as time goes on, in view of the ever further decreasing smallest feature sizes of the microelectronic components.

In order to meet these requirements, several types of very low-defect semiconductor wafers were developed: polished semiconductor wafers produced from extremely low-defect single crystals (e.g. EP0972094B1), thermally treated semiconductor wafers (e.g. EP0829559B1) or semiconductor wafers having an epitaxially deposited silicon layer.

It has been found, however, that even the best semiconductor wafers known at the present time pose problems in specific applications, such as, for example, SOI (Silicon On Insulator), Strained Silicon or sSOI (strained Silicon On Insulator), associated with line widths (design rule)<100 nm during production or during operation of the components. Thus, leakage currents, short circuits, deviating diode characteristic curves, hot spots, gate oxide failure or poor reliability of the components lead to failure. This is described comprehensively and extensively in the literature, for example:

It is thus described that ingrown vacancy clusters lead to problems in the reliability of the gate oxide [K. Yamabe, K. Taniguchi, Y. Matsushita, in PROC. OF THE INTERNAT. RELIABILITY PHYS. SYMP., IEEE, NJ, 184 (1983)], component isolation faults [M. Muranaka, K. Makabe, M. Miura, H. Kato, S. Ide, H. Iwai, M. Kawamura, Y. Tadaki, M. Ishihara, T. Kaeriyama, JPN. J. APPL. PHYS., 37, 1240 (1998)] and faults in memory trenches [E. Dornberger, D. Temmler, W. v. Ammon, J. ELECTROCHEMICAL SOCIETY 149, G226-G231(2002)]. These problems are aggravated with increasing structure miniaturization—particularly when the vacancy clusters reach the magnitude of typical component magnitudes such as e.g. gate lengths. Vacancy clusters lead to tiny pits in SOI structures and to holes in very thin silicon films, and are thus "killer defects" [G. K. Keller, S. Cristoloveanu, J. APPL. PHYS. 93, 4955 (2003)].

The semiconductor wafers mentioned above can only inadequately meet the demands imposed by future generations of components, in particular as far as the areal and local properties of the defect homogeneity are concerned.

SUMMARY OF THE INVENTION

An object of the invention was to provide a semiconductor wafer in which the problems described do not occur even upon further miniaturization of the components. These and other objects are achieved by means of a monocrystalline semiconductor wafer having defect-reduced regions, wherein the defect-reduced regions have a density of GOI-relevant defects within the range of $0/cm^2$ to $0.1/cm^2$ and occupy overall an areal proportion of 10% to 100% of the planar area of the semiconductor wafer, wherein the remaining regions of the semiconductor wafer have a significantly higher defect density than the defect-reduced regions.

BRIEF DESCRIPTION OF THE DRAWINGS

The invention is described in more detail below with reference to figures.

DETAILED DESCRIPTION OF THE PREFERRED EMBODIMENTS

Figure 1:
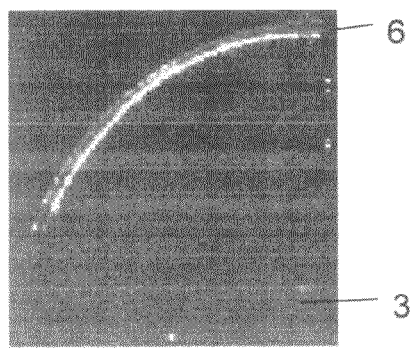
FIG. 1 shows GOI relevant defects in the edge region of a quadrant of a silicon wafer according to the invention that were measured with the aid of the method disclosed in DE19835616A1. The defects are represented as light points.

The term "GOI relevant" defects denotes all defects which adversely affect the quality of a gate oxide produced at the corresponding location. The density of the GOI relevant defects is preferably measured with the aid of the method of IR-Lock-In thermography disclosed in DE19835616A1, since this method enables large-area detection of precisely those defects which cause GOI defects. Thus, in contrast to conventional GOI tests, even very low defect densities of $0.1/cm^2$, for example, can be determined quantitatively.

By contrast, other detection methods such as e.g. laser scanning methods by which the entire wafer surface is examined for defects are significantly less well suited since although the defects detected by said methods can lead to a failure of a component, they need not necessarily lead to such failure. Defects that have no influence on the GOI-quality, such as e.g. particles adhering to the surface, are also detected. On the other hand, in the production of microelectronic components, not only the surface of the semiconductor wafer but also a certain layer below the surface is utilized. This means that detection methods which only examine the wafer surface or a depth perpendicular to the surface that is inadequate for the later component cannot, in principle, find all GOI-relevant defects.

GOI-relevant defects are, for example, vacancy clusters ("crystal originated particles", COPs or Voids) or oxygen precipitates (also called "bulk micro defects", BMDs).

According to the invention, the defect-reduced regions of the semiconductor wafer occupy a proportion of 10% to 100% of the planar area of the semiconductor wafer. The term planar area denotes the entire region of the substantially parallel areas of at least one side of the semiconductor wafer. Said region is utilized maximally for the production of microelectronic components. By contrast, the planar area does not include a beveling or rounding generally present at the edge, i.e. in the circumferential region of the semiconductor wafer.

The defect-reduced regions have a very low and preferably extremely homogeneous density of GOI-relevant defects. Preferably, the density of the GOI relevant defects deviates at arbitrary locations within the defect-reduced regions by at most 10% from the average value of the density of GOI relevant defects that is determined in the defect-reduced regions. The remaining regions of the semiconductor wafer have a significantly higher defect density than the defect-reduced regions. Preferably, the density of GOI relevant defects in the remaining regions is at least twice as great as in the defect-reduced regions.

The defect-reduced regions according to the invention preferably have a defined lateral extent, i.e. a defined extent parallel to the surface of the semiconductor wafer. This is manifested by the fact that the density of the GOI relevant defects changes abruptly at the boundaries between the defect-reduced regions and the remaining regions of the semiconductor wafer. Preferably, the density of GOI relevant defects changes by at least a factor of 2 at the boundaries between the defect-reduced regions and the remaining regions along a section having a length of 0.5 mm that runs parallel to the planar areas of the semiconductor wafer and perpendicular to the respective boundary between the defect-reduced region and the non-defect-reduced region. In contrast to semiconductor wafers in accordance with the prior art which likewise have regions having a relatively low density of GOI relevant defects and other regions having a relatively high density of GOI relevant defects, these different regions in a semiconductor wafer according to the invention do not merge fluidly into one another, but rather are sharply demarcated from one another.

Defect-optimized silicon in accordance with the prior art has a high density of very small defects having a diameter of less than 30 nm. The semiconductor wafers according to the invention also have a very low density of these small defects. In contrast to the prior art, however, the semiconductor wafers according to the invention achieve a density of GOI relevant defects of down to $0/cm^2$.

Preferably, the defect-reduced regions extend over the entire thickness of the semiconductor wafer. They therefore differ significantly in this feature, too, from the conventional low-defect layers at the surface of semiconductor wafers which are produced for example by suitable thermal or epitaxial methods. The depth of these known low-defect layers is generally only a few micrometers.

In accordance with one preferred embodiment of the invention, the defect-reduced regions occupy substantially the entire planar area of the semiconductor wafer. This should be understood to mean preferably an area proportion of 95% to less than 100% or even to 100% of the planar area of the semiconductor wafer. The advantages of this embodiment are the homogeneity that can be achieved, a higher yield in chip production, maximum area utilization and simple production and process sequences.

Figure 2:
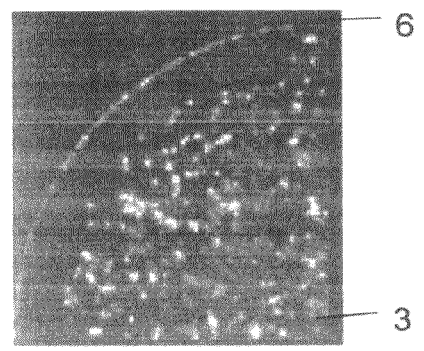
FIG. 2 shows, analogously to FIG. 1, GOI-relevant defects on a quadrant of a silicon wafer that is not according to the invention.

One example of this embodiment is illustrated in FIG. 1. The GOI-relevant defects were measured with the aid of the method disclosed in DE19835616A1. The entire planar area of the represented quadrant of the silicon wafer 3 according to the invention is dark, i.e. virtually free of defects. It is only in the beveled edge region 6, i.e. outside the planar area, that a relatively high defect density can be discerned at the multiplicity of light points. In comparison with this, FIG. 2 illustrates a silicon wafer in accordance with the prior art measured by the same method. In the case of this wafer, a relatively high density of GOI relevant defects can be discerned on the entire planar area.

In accordance with another preferred embodiment of the invention, the defect-reduced regions occupy only part of the planar area of the semiconductor wafer, preferably an area proportion of 10% to 95% of the planar area.

Preferably, the defect-reduced regions coincide with the regions on the semiconductor wafer in which a high GOI quality is important. These are regions in which components such as transistors and memory devices, for example, are produced.

In accordance with this embodiment, the remaining, non-defect-reduced regions are situated at locations at which a high GOI quality is not of importance since no gate oxide is produced in these regions. This is the case for example along the lines at which the semiconductor wafer is cut apart ("dicing") after production of the components and, if appropriate, thinning back (e.g. grinding back), in order to separate the individual microchips from one another. GOI-relevant defects are non-critical also at the locations at which interconnects are applied to the semiconductor wafer.

Further regions in which the GOI quality is unimportant are, for example, test regions (apart from for a GOI test), contact regions or regions which carry a wafer identifier or are provided for the application of serial chip numbers or alignment marks.

This means that the position of the defect-reduced regions is defined by the arrangement of the microelectronic components that are produced later on the semiconductor wafer. In this embodiment of the invention, the intended later arrangement of the relevant components must already be known at the time of producing the semiconductor wafer according to the invention.

This embodiment of the invention has two significant advantages: firstly, the density of the GOI relevant defects has be reduced only on part of the area of the semiconductor wafer, which increases the economic viability of production. Secondly, the GOI relevant defects, in particular the BMDs (Bulk Micro Defects), act as gettering centers, that is to say that they bind metallic impurities with which the semiconductor wafer is inevitably contaminated during the production of the components and which alter the conduction characteristic of the semiconductor material in an uncontrolled and undesirable manner. The presence of BMDs in regions in which a high GOI quality is not required is therefore desirable. Consequently, both an extremely low and homogeneous density of the GOI relevant defects in the critical regions and good gettering capability are ensured in this embodiment.

The semiconductor wafer may comprise any desired semiconductor material, but it preferably comprises substantially, that is to say at least 80%, silicon. The semiconductor wafer can also comprise substantially pure silicon to which only the customary dopants are added.

The semiconductor wafer according to the invention can be produced by suitable irradiation of a semiconductor wafer by means of laser.

The invention therefore also relates to a method for annealing GOI relevant defects in a monocrystalline semiconductor wafer, wherein defined regions of at least one side of the semiconductor wafer are irradiated by means of a laser, wherein each location within the defined regions is irradiated with a power density of 1 $GW/m^2$ to 10 $GW/m^2$ for a duration of at least 25 ms, wherein the laser emits radiation having a wavelength lying above the absorption edge of the semiconductor material of which the semiconductor wafer is composed, and wherein the temperature of the semiconductor wafer rises by less than 20 K as a result of the irradiation by means of the laser.

Methods for treating semiconductor materials by means of laser radiation are known in the prior art. By way of example, DD249998A1 discloses the irradiation of a silicon wafer by means of a light source, for example a laser, wherein the light source is to be chosen, however, such that it emits a high proportion of wavelengths below the absorption edge of silicon, in order that the radiation is absorbed by the silicon wafer and the wafer is thereby heated in order to produce getterable defects. EP68094A2 discloses a method in which a wafer that has already been patterned in the context of component production is locally irradiated by means of a laser in order to recrystallize polycrystalline silicon regions by local melting of said regions. For this purpose, it is necessary to use a laser whose radiation is absorbed by silicon, that is to say which emits light having a wavelength below the absorption edge of silicon. A frequency-doubled Nd:YAG-laser having a wavelength of 532 nm is used, for example. U.S. Pat. No. 6,743,689B1 discloses a similar method, in which an already patterned semiconductor wafer is irradiated locally by means of a laser in the course of component production in order to crystallize amorphous regions by increasing the temperature to 1200 to 1300° C.

All these known methods pursue the aim of greatly increasing the temperature of the semiconductor wafer locally through absorption of the laser radiation in order to achieve certain effects.

By contrast, the method according to the invention operates at a wavelength lying above the absorption edge of the semiconductor material. By way of example, the absorption edge of silicon is at 1.1 eV, corresponding to a wavelength of approximately 1050 nm. The semiconductor material is therefore substantially transparent to said radiation, the latter being absorbed by the semiconductor material only to a small extent. For this reason, the temperature of the semiconductor wafer rises by less than 20 K, preferably even by less than 6 K, as a result of the irradiation by means of the laser. The term "temperature of the semiconductor wafer" means the average, i.e. global, temperature of the semiconductor wafer. The temperature of the semiconductor wafer is preferably kept within the range of 20° C. to 50° C. during the irradiation by means of the laser. It is only at the currently irradiated location of the semiconductor wafer that the local temperature can reach significantly higher values, but it preferably does not rise above 800° C.

Nevertheless, defects present in the semiconductor wafer can surprisingly be annealed by the irradiation according to the invention without appreciably increasing the temperature of the semiconductor wafer. By way of example, COP defects and BMD defects in monocrystalline silicon wafers, which are unavoidable in most crystal pulling processes, can be resolved by the irradiation according to the invention.

The mode of action of the method according to the invention can be explained as follows: although the semiconductor material itself absorbs little radiation, the temperature of the currently irradiated volume of the semiconductor wafer does not rise above 800° C. (which is insufficient for the annealing of defects) and the global temperature of the wafer remains virtually unchanged, an interaction between the defects and the radiation does indeed take place. Calculations show that temperature increases by a few 10,000 K that are locally delimited to the defect are possible as long as the defect has optical properties that differ from the surrounding silicon. Such properties are based on regions having different light refraction and surfaces of cavities in the semiconductor material. As soon as the defect is resolved, for example in the case of a COP by diffusion of vacancies from the COP into the crystal lattice or in the case of a BMD by diffusion of oxygen from the BMD into the crystal lattice (the oxygen being present as interstitial oxygen), the defect no longer effects scattering. Radiation energy is not absorbed any further and the locally greatly heated location immediately emits its thermal energy to the cold surrounding semiconductor material. As a result of the temperature equalization that takes place immediately, the temperature in the region of the former defect falls to the initial value so rapidly that the vacancies cannot reaggregate to form a new COP or the oxygen cannot reaggregate to form a new BMD.

The method according to the invention makes it possible to produce a semiconductor wafer according to the invention with a very low and homogeneous density of GOI relevant defects since every location of the semiconductor wafer which lies in one of the desired defect-reduced regions can be treated under absolutely identical conditions.

This is not possible with the methods of the prior art. Such methods provide, for example, particular conditions during the production of the single crystal (e.g. by crystal pulling according to Czochralski) in order to suppress formation of defects to the greatest possible extent. Local influencing cannot be effected with CZ methods because radially symmetrical property distributions are always established. Another possibility in accordance with the prior art, consists in subjecting a monocrystalline semiconductor wafer having GOI-relevant defects in a specific size distribution and density to a thermal treatment in order to anneal the defects, at least in a layer near the surface. Inhomogeneities of the raw material cannot be completely compensated for, even by a homogeneous temperature treatment. Moreover, the known methods do not enable the properties of the semiconductor wafer to be influenced locally, because in the development of the methods particular attention was always paid to processing entire semiconductor wafers in the shortest possible time.

In the case of thermally treated semiconductor wafers, a very low-defect layer (so-called "denuded zone") arises at the surface, while defects can still be detected in the depth of the semiconductor wafer. By contrast, through application of the method according to the invention, a reduction of defects is achieved over the entire thickness of the semiconductor wafer.

Since the semiconductor wafer is not heated globally in the method according to the invention, further advantages are afforded over the methods of the prior art:

The thermal budget of the semiconductor wafer is not increased by the treatment according to the invention. This means that no nucleation and no diffusion take place in the solid and, consequently, other types of defects cannot arise or grow. Since no contamination occurs at the surfaces, the charge carrier lifetime remains virtually unchanged.

Practically no diffusion processes take place in the globally cold semiconductor wafer. Dopant concentrations set during the production of the single crystal are therefore maintained unchanged.

The mechanical properties of the semiconductor wafer are altered neither temporarily nor permanently by the inventive treatment. For larger wafer diameters, such as 200 mm or higher (e.g. 300 mm and 450 mm wafer diameters), increasing point loadings are produced in the supports for thermal processes. In contrast to this, in the method of the invention, there is no risk of plastic deformation of the semiconductor wafer that leads to damage to the crystal lattice, in particular to slip. Generally, slip cannot propagate in the cold semiconductor material. Thermal gradients are locally delimited to the regions in the laser beam and around the defects. Consequently, no global thermal stresses occur in the semiconductor wafer. This significantly reduces the risk of fracture of the semiconductor wafer during and after the treatment.

The method is generally applied to substantially round, unpatterned semiconductor wafers. Preferably, the starting material chosen should be a semiconductor wafer having defects which on average have a diameter of less than 70 nm, since small defects are resolved more rapidly and the time expended on the method is thereby reduced. Semiconductor wafers having an average defect diameter of more than 70 nm can likewise be freed of the GOI-relevant defects by the inventive method, but longer irradiation times should be chosen.

The particular parameters of the laser irradiation depend on the properties of the semiconductor material. Since silicon is currently the most important semiconductor material, concrete parameters are described for silicon, but the application of the method according to the invention is not restricted to silicon.

In the case of silicon, lasers which emit light having a wavelength of 1 μm to 7 μm are suitable, for example 1.060 μm (InGaAsP diode laser), 1.064 μm (Nd:YAG laser), 2.127 μm (Ho:YAG laser), 2.940 μm (Er:YAG laser).

The wavelengths 1.064 μm and 4.25 μm, are particularly preferred since there is particularly low absorption of light of these wavelengths in silicon.

In the case of silicon, the power density of the laser beam lies within the range of 1 $GW/m^2$ to 10 $GW/m^2$. The laser beam is preferably set to a non-divergent beam having a diameter of 3 μm to 10 μm.

The absorption of energy (in W) is proportional to the cross section of the defect, that is to say to the square of its radius, while the volume of the defect is proportional to the cube of the defect radius. In order to fill the defect with melt, an energy dependent on the volume is required. The cross section is the light-capturing quantity.

The energy density therefore limits the size of the defects which can be annealed. It is not possible to set an arbitrarily high energy density since the semiconductor wafer melts and the surface quality is destroyed. If an even higher energy density were applied, the semiconductor wafer would be cut by the laser beam, which is undesirable.

Figure 4:
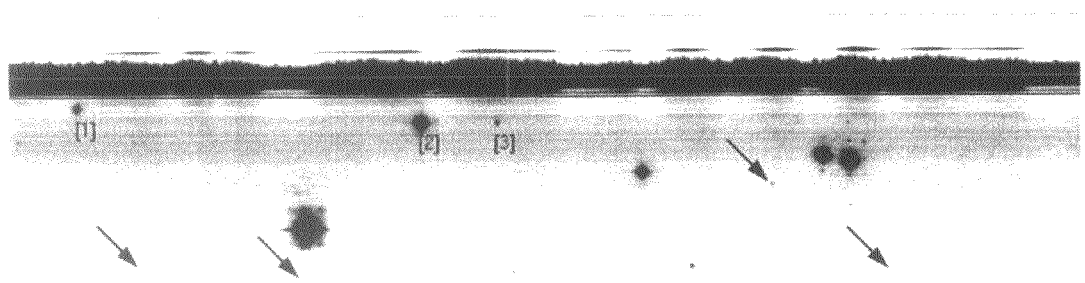
FIG. 4 shows defects behind the fracture edge of a silicon wafer before irradiation by means of a laser.
Figure 5:
FIG. 5 shows the same fracture edge as FIG. 4, but after brief irradiation by means of a laser.

FIG. 4 shows frontally a fracture edge of a conventional defect-reduced silicon wafer which was examined for defects using the measuring device "Bulk Micro Defect Analyzer MO-441" (from Mitsui Mining and Smelting, Japan). To prepare the sample, a silicon wafer was fractured along a preferred direction of the crystal lattice perpendicular to its planar surfaces. During the measurement, individual defects lying in a range of 20 to 30 μm behind the fracture edge are detected and their position is visualized. A total of 26 defects can be discerned as dark points. The regions of the silicon wafer adjoining the fracture edge were subsequently irradiated by means of a laser for a very short time. FIG. 5 shows the same silicon wafer after this treatment. Of the 26 original defects present, four defects are no longer detectable. These are identified by arrows in FIGS. 4 and 5. To resolve all of the defects, including the large defects, a longer irradiation duration is necessary.

A semiconductor wafer has by its nature a high density of non-agglomerated point defects (in particular vacancies and interstitial oxygen). The point defects can be outdiffused from the semiconductor wafer (in the case of oxygen) or be recombined with interstitial silicon (in the case of vacancies) by means of a subsequent thermal treatment if this is necessary or advantageous for the envisaged use of the semiconductor wafer. If the free vacancies formed by the resolution of the COPs are to be eliminated, the silicon wafer, after application of the method according to the invention, is subjected to a thermal treatment that is suitable for injecting interstitial silicon atoms which can recombine with the vacancies.

Figure 3:
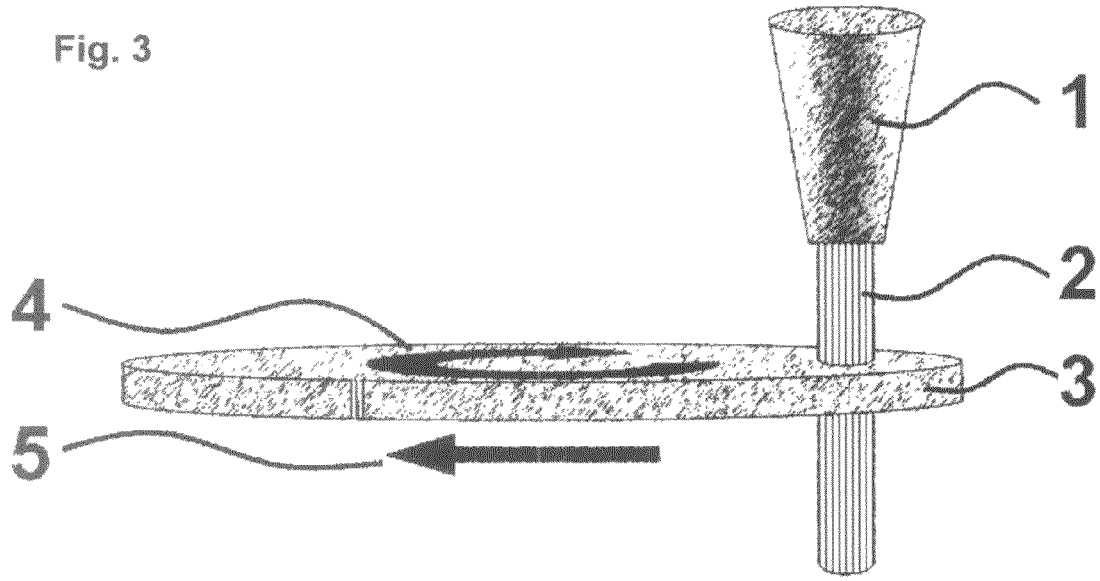
FIG. 3 shows a schematic illustration of an embodiment of the method according to the invention in which the semiconductor wafer is scanned helically by means of the laser beam.

In the preferred embodiment of the inventive method as illustrated in FIG. 3, the entire surface of the semiconductor wafer 3 is scanned by means of a laser 1. The simultaneous use of a plurality of lasers is also possible. The material of the semiconductor wafer is largely transparent to the laser beam 2. The laser beam 2 has a defined cross section. In order to treat the entire area of the semiconductor wafer 3, the semiconductor wafer can be rotated (4) about its axis. At the same time, the relative position of laser 1 and semiconductor wafer 3 is slowly shifted in the radial direction (5). This is preferably done in such a way that the region in which the laser beam 2 impinges on the semiconductor wafer 3 moves by not more than one beam diameter in the radial direction after one rotation. A whole-area treatment can also be achieved in a similar manner by scanning the semiconductor wafer line by line. In this case, the rotation 4 of the semiconductor wafer 3 should be replaced by a second linear movement, preferably directed perpendicular to the movement 5.

Edge regions of the semiconductor wafer can be excluded from the irradiation during the scanning. Regions that are not intended to be converted into defect-reduced regions can likewise be excluded. Since the irradiation takes place locally, it is possible to produce both homogeneous and in targeted fashion inhomogeneous properties of the defect distribution. In any case the relative movement between laser and semiconductor wafer is controlled such that every location within a region that is intended to be converted into a defect-reduced region is irradiated at least for 25 ms.

In a further embodiment, the defect distribution on the semiconductor wafer is measured prior to the laser treatment and the parameters of the laser treatment are adapted to the local defect sizes, etc. This also improves the throughput and hence the economic viability of the method.

Further preferred embodiments of the method according to the invention result from adaptation to the properties of the semiconductor wafer before the treatment according to the invention and also to the desired properties after said treatment. In particular the power density of the laser beam and the required duration of the irradiation are defined by the type and size of the defects to be resolved.

By way of example, an irradiation duration of more than 25 ms and a power density of the laser beam of between 5 and 10 $GW/m^2$ are used in order to resolve COPs having a diameter of less than 90 nm in a silicon wafer.

An irradiation duration of more than 25 ms and a power density of the laser beam of between 7.5 and 10 $GW/m^2$ are employed in order to destroy the oxide layer on the inner wall of COPs having a diameter of less than 1250 nm. COPs having an oxide layer and a diameter of less than 90 nm can be completely resolved under these conditions.

A power density of more than 1 $GW/m^2$ and an exposure time of more than 25 ms can be used for resolving BMDs.

The method of the invention is able to produce all semiconductor wafers of the invention in accordance with the claims, but is not restricted thereto.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A monocrystalline semiconductor wafer having defect-reduced regions, wherein said defect-reduced regions have a density of GOI-relevant defects within the range of 0/cm$^2$ to 0.1/cm$^2$ and occupy overall an area proportion of 10% to 100% of the planar area of the semiconductor wafer, wherein remaining regions of the semiconductor wafer have a significantly higher defect density than the defect-reduced regions.

2. The monocrystalline semiconductor wafer of claim 1, wherein the density of the GOI relevant defects in the remaining regions is at least twice as great as in the defect-reduced regions.

3. The monocrystalline semiconductor wafer of claim 1, wherein the density of the GOI relevant defects deviates at arbitrary locations within the defect-reduced regions by at most 10% from the average value of the density of the GOI relevant defects that is determined in the defect-reduced regions.

4. The monocrystalline semiconductor wafer of claim 1, wherein the defect-reduced regions extend over the entire thickness of the semiconductor wafer.

5. The monocrystalline semiconductor wafer of claim 3, wherein the defect-reduced regions extend over the entire thickness of the semiconductor wafer.

6. The monocrystalline semiconductor wafer of claim 1, wherein the defect-reduced regions occupy an area proportion of 95% to 100% of the planar area of the semiconductor wafer.

7. The monocrystalline semiconductor wafer of claim 3, wherein the defect-reduced regions occupy an area proportion of 95% to 100% of the planar area of the semiconductor wafer.

8. The monocrystalline semiconductor wafer of claim 4, wherein the defect-reduced regions occupy an area proportion of 95% to 100% of the planar area of the semiconductor wafer.

9. The monocrystalline semiconductor wafer as claimed claim 1, wherein the defect-reduced regions occupy an area proportion of 10% to 95% of the planar area of the semiconductor wafer.

10. The monocrystalline semiconductor wafer of claim 1, wherein the density of the GOI relevant defects changes abruptly at the boundaries between the defect-reduced regions and the remaining regions of the semiconductor wafer.

11. The monocrystalline semiconductor wafer of claim 10, wherein the density of the GOI relevant defects changes by at least a factor of 2 at the boundaries between the defect-reduced regions and the remaining regions along a section having a length of 0.5 mm that runs parallel to the planar areas of the semiconductor wafer and perpendicular to the respective boundary.

12. The monocrystalline semiconductor wafer of claim 1, which comprises at least 80% silicon.

13. The monocrystalline semiconductor wafer of claim 5, wherein the defect-reduced regions occupy an areal proportion of 95% to less than 100% of the planar area of the semiconductor wafer.

* * * * *